United States Patent
Hong et al.

(10) Patent No.: US 6,177,292 B1
(45) Date of Patent: Jan. 23, 2001

(54) METHOD FOR FORMING GAN SEMICONDUCTOR SINGLE CRYSTAL SUBSTRATE AND GAN DIODE WITH THE SUBSTRATE

(75) Inventors: Chang-Hee Hong, Seoul; Sun Tae Kim, DaeJeon-si, both of (KR)

(73) Assignee: LG Electronics Inc., Seoul (KR)

( * ) Notice: Under 35 U.S.C. 154(b), the term of this patent shall be extended for 0 days.

(21) Appl. No.: 08/985,440

(22) Filed: Dec. 5, 1997

(30) Foreign Application Priority Data

Dec. 5, 1996 (KR) ................................................ 96/61922
Dec. 27, 1996 (KR) ................................................ 96/73518
Dec. 31, 1996 (KR) ................................................ 96/79263
Jun. 13, 1997 (KR) ................................................ 97/24550

(51) Int. Cl.[7] ........................... H01L 21/20; H01L 33/00; H01S 3/19

(52) U.S. Cl. ............................ 438/46; 438/47; 438/481; 438/493; 117/952; 257/13; 257/76; 257/103; 372/43; 372/44

(58) Field of Search .................................. 438/22, 45, 46, 438/47, 455, 458, 459, 479, 492, 493, 497, 500, 503, 507, 928, 959, 967; 117/1, 92, 97, 952; 257/12, 13, 14, 15, 76, 103, 615; 372/43, 44

(56) References Cited

U.S. PATENT DOCUMENTS 5,665,986 * 9/1997 Miaura et al. .

* cited by examiner

Primary Examiner—Charles Bowers
Assistant Examiner—Keith Christianson
(74) Attorney, Agent, or Firm—John P. White; Cooper & Dunham LLP

(57) ABSTRACT

Method for forming a single crystal GaN semiconductor substrate and a GaN diode with the substrate is disclosed which forms in a short time period, has a low crystal defect concentration and allows forming a size large enough to fabricate an optical device, the method including either the steps of fast growth of a GaN group material on an oxide substrate to a thickness without cracking and subjecting to mechanical polish to remove a portion of the oxide substrate, and growing GaN again on the grown GaN layer and complete removal of the remaining oxide substrate to obtain a GaN film, or the steps of separating the oxide substrate from the GaN layer utilizing cooling to obtain a GaN film, grown GaN on the GaN film to a predetermined thickness to form a GaN bulk single crystal and mirror polishing it to form the GaN single crystal substrate, whereby a defectless GaN single crystal substrate of a size required for fabrication of an optical device can be obtained within a short time period because fast homoeptaxial growth of a GaN film is allowed.

30 Claims, 7 Drawing Sheets

METHOD FOR FORMING GAN SEMICONDUCTOR SINGLE CRYSTAL SUBSTRATE AND GAN DIODE WITH THE SUBSTRATE

BACKGROUND OF THE INVENTION

1. Field of the Invention

The present invention is related to a method for forming a single crystal GaN substrate, and more particularly, to a method for forming a single crystal GaN semiconductor substrate, which allows fast homoepitaxial growth of GaN group materials, and formation of a bulk single crystal GaN substrate, which has a very high quality almost free from crystalline defects, of a size required for growth of thin film in fabrication of an optical device; and a GaN diode fabricated with the single crystal substrate.

2. Discussion of the Related Art

In a conventional growth of GaN which is used in fabrication of blue optical device, a sapphire($Al_2O_3$) substrate has been mostly used. However, the significant lattice mismatch (13.8%) and difference(25.5%) of thermal expansion coefficients between gallium nitride and sapphire cause difficulty in growing a good quality thin film. Even if a buffer layer disclosed in JP H4-170390 is employed in the growth of the thin film, the concentration of crystal defects occurring in the grown thin film is $10^9$–$10^{11}$ $cm^{-2}$, which should be significantly reduced for practical laser diode applications, even though they may not cause any significant problems in LED applications. Although many efforts have been made for reducing the lattice mismatch employing silicon carbide(SiC) or spinnel as the substrate, which have lattice mismatches less than sapphire, the concentration of internal crystal defects in the grown thin film caused by the lattice mismatch could not be reduced significantly. Moreover, the difference of cleavage directions of GaN and sapphire in using a sapphire substrate causes difficulty in the application of a general cleaving method to fabrication of a laser cavity and also to the formation of electrodes on the back side of the sapphire substrate, which is an insulator. This places a limitation in the fabrication of a LED because the electrode formation process becomes complicated.

The requirement for employing a GaN substrate to overcome the aforementioned problems and to grow a large sized bulk single crystal GaN at room temperature equilibrium by an existing crystal growth method has been impossible because GaN has a melting point of over 2400° C. while nitrogen $N_2$ has an equilibrium vapor pressure of about 100 Kbar at 1,100° C. and 10,000 Kbar at 1,500° C. Recently, I. Gzegory et al. in "J. Phys. Chem. Solids, 56,656(1995)" discloses a solution method conducted at a high temperature and high pressure state of 1,300–1,600° C. and 8–17 Kbar to obtain a thin single crystal plate of a several millimeter size having a good quality with crystal defect concentration of about 100/$cm^2$, which is still not satisfactory for use as a substrate. Detchprhom et al. in "J. Crystal Growth, 123,384 (1993)" discloses a method in which a thick GaN layer is grown by HVPE (Halide Vapor Phase Epitaxy) on a ZnO buffer layer which has a comparatively little lattice mismatch of 2.2% with GaN formed on a sapphire substrate and the ZnO buffer layer is removed to separate bulk GaN single crystal layer from the sapphire substrate, intending to use the bulk GaN single crystal layer as a substrate. However, this method has a limitation in obtaining a good quality substrate of a required size due to the unstable chemical etching of the ZnO layer. T. Okada et al. in "J. J. Applied Physics, 35(5), 1637, 1966" discloses a sublimation method in which powdered GaN is subjected to sublimation into a GaN substrate under an ambient of nitrogen and ammonia, which was found not satisfactory. And, recently, R. J. Molnar et al. in "MRS Symp. Proc. Vol. 423,221, 1996" discloses a method in which about 50 µm thick GaN is grown on a sapphire substrate to form a homoepitaxy. However, as this method also requires a form of heterepitaxy, this method has a limitation in reducing the crystalline defect concentration in a GaN film.

SUMMARY OF THE INVENTION

Accordingly, the present invention is directed to a method for forming a single crystal GaN substrate and a GaN diode with the substrate that substantially obviates one or more of the problems due to limitations and disadvantages of the related art.

An object of the present invention is to provide a method for forming a good quality bulk GaN group single crystal substrate of an area required for growth of a thin film in fabrication of an LED using homoepitaxy.

Another object of the present invention is to provide a method for forming a GaN single crystal substrate, which can be processed within a short time.

Another object of the present invention is to provide a method for forming a GaN single crystal substrate which has not only a low crystalline defect concentration, but also excellent reproducibility.

A Further object of the present invention is to provide a blue laser diode where possible crystal defects caused by lattice mismatch and thermal expansion coefficient are avoided by using an $n^+$-GaN substrate grown by HVPE; and a method for fabricating the same.

A still further object of the present invention is to provide a GaN light emitting diode from which crystal defects caused by a lattice mismatch and a thermal expansion coefficient difference between a substrate and a light emitting device on the substrate are removed; and a method for fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a GaN single crystal substrate includes the steps of (1) providing and pre-treating an oxide substrate, (2) growing a primary GaN layer on the pre-treated oxide substrate, (3) polishing the oxide substrate having the primary GaN layer grown thereon to remove a portion of the oxide substrate, (4) growing GaN again on the primary GaN layer after the step (3) to form a secondary GaN layer, (5) polishing the oxide substrate again to remove the remaining portion of the oxide substrate entirely, (6) growing a tertiary GaN layer on the primary and secondary GaN layers having the oxide substrate removed completely therefrom to form a bulk of a GaN semiconductor single crystal, and (7) polishing the GaN semiconductor single crystal to form a mirror like polished GaN substrate.

In other aspect of the present invention, there is provided a method for forming a GaN single crystal substrate including the steps of (1) providing an oxide substrate and pre-treating the oxide substrate in the reactor, (2) growing GaN on the pre-treated oxide substrate, to form a primary GaN layer, (3) cooling down the oxide substrate and the primary GaN layer, to separate the primary GaN layer from the oxide substrate, (4) growing GaN in a high growth rate with the separated GaN layer used as a substrate to form a secondary GaN layer, and forming a GaN bulk single crystal of a predetermined thickness from the secondary GaN layer, and (5) polishing the GaN bulk single crystal to form a mirror-like polished GaN single crystal substrate.

In another aspect of the present invention, there is provided a GaN light emitting diode, including n+-type GaN substrate obtained by homoeptaxial growth with a halide vapor phase epitaxy and silicon doping, an n-type clad layer of $Ga_xAl_{1-x}n$ ($0 \leq x \leq 1$) grown on the n+-type GaN substrate, an active layer of $In_xGa_{1-x}N$ ($0 \leq x \leq 1$) grown on the n-type clad layer and doped with magnesium, a p-type clad layer of an $Ga_xAl_{1-x}N$ layer($0 \leq x \leq 1$) grown on the active layer, and an n-type ohmic contact electrode and a p-type ohmic contact electrode on an under side of the substrate and on the p-type clad layer, respectively.

In a further aspect of the present invention, there is provided a blue laser diode, including, an n-type GaN layer, an n-type $In_xGa_{1-x}N$ layer($0 \leq x \leq 1$), an n-type $Al_xGa_{1-x}N$ layer and an n-type GaN layer, all of which are silicon doped, on an n+-type GaN substrate homoeptaxially grown by halide vapor phase epitaxy an active layer of a multiple quantum well form having a plurality of alternative layers of a well layer of $In_{0.2}Ga_{0.8}N$ and a barrier layer of $In_{0.05}Ga_{0.95}N$ on the last n-type GaN layer, a stack of a p-type $Al_xGa_{1-x}N$ layer, a p-type GaN layer, a p-type $Al_xGa_{1-x}N$ layer and a p-type GaN layer, all of which are magnesium doped, on the active layer in succession, and an n-type ohmic contact electrode and a p-type ohmic contact electrode on an under side of the substrate and on the last p-type GaN layer, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
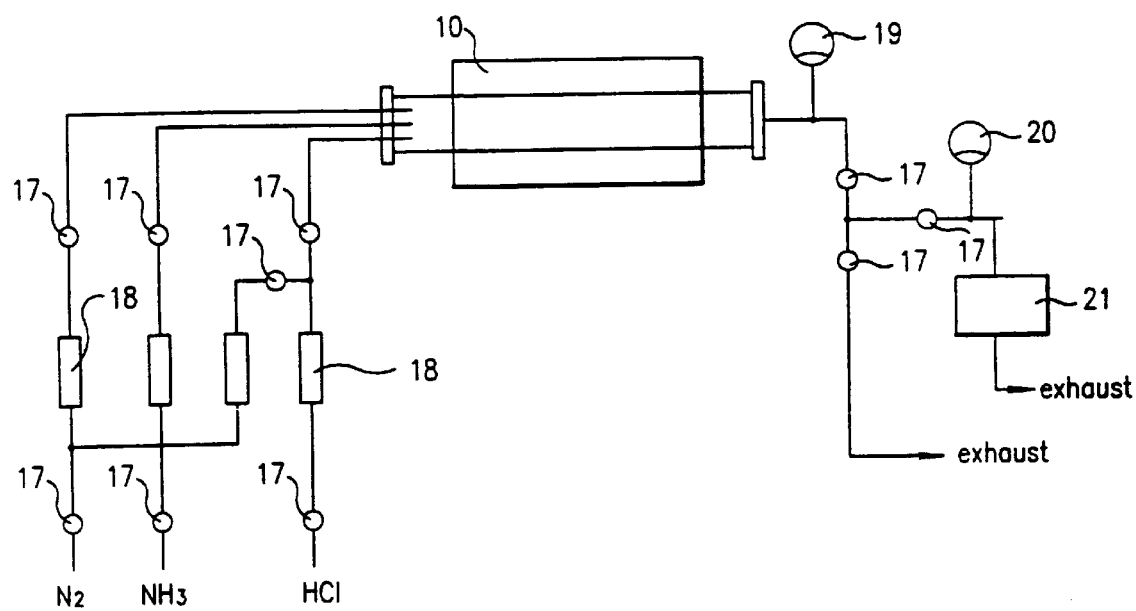
FIG. 1 schematically illustrates a halide vapor phase epitaxy device for implementing a method of the present invention.

Reference will now be made in detail to the preferred embodiments of the present invention, examples of which are illustrated in the accompanying drawings. FIG. 1 schematically illustrates a halide vapor phase epitaxy device for implementing a method of the present invention.

Figure 2:
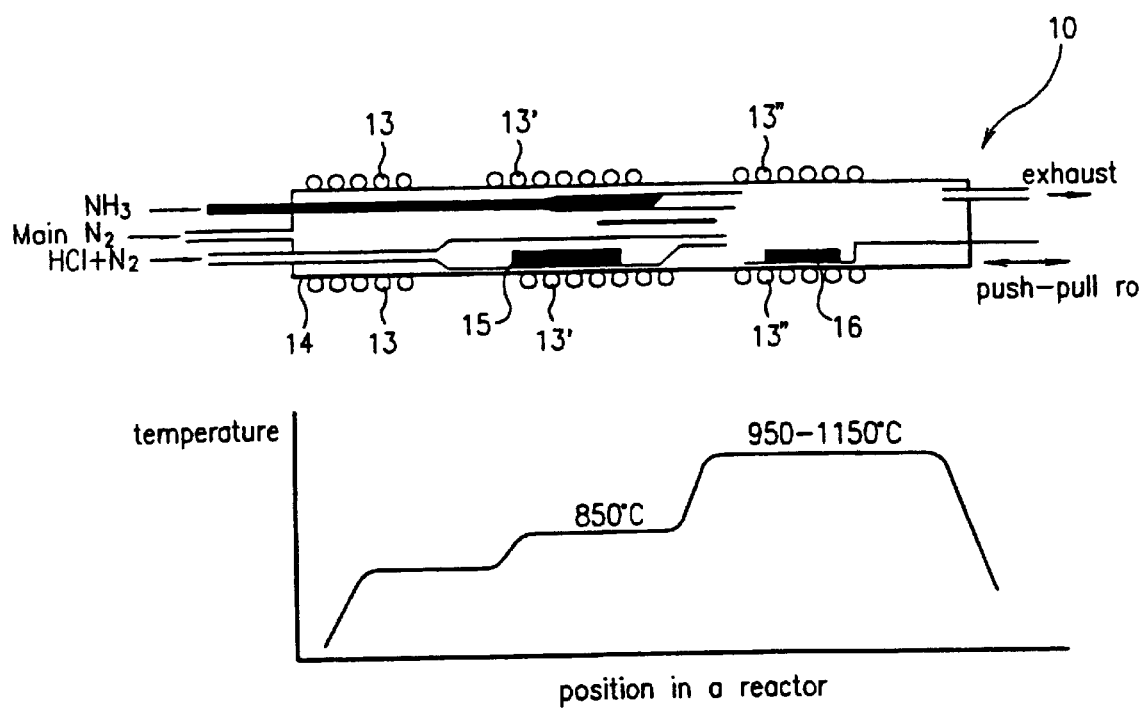
FIG. 2 illustrates an enlarged view of the reacting part shown in FIG. 1.

Referring to FIG. 1, the halide vapor phase epitaxy device includes a reactor 10 for making reaction of gases in growing a semiconductor chemical, a gas supplying part 11 for regulating supply of gases to the reactor 10, and a gas diffuser 12 for supplying the gases in the reactor 11. As shown in FIG. 2, the reactor 10 includes 3 stages of horizontal electric furnaces 13, 13' and 13" and a quartz reacting tube 14 of about 80 mm diameter in which a quartz boat 15 for accommodating Ga is placed in a central portion thereof which is maintained at a temperature of 850° C. and a suscepter 16 for disposal of an oxide substrate therein is placed in a high temperature region thereof which is maintained at a temperature of 1,000~1,150° C. $NH_3$, $N_2$ and $HCl+N_2$ gases are fed to the quartz reacting tube 14 at 300 cc/min, 3000 cc/min, and 30 cc/min+300 cc/min respectively are regulated by respective ball valve 17 and mass flow controller 18 shown in FIG. 1. The processed gas in the quartz tube is discharged using a pressure gage 19, a vacuum gage 20, and a vacuum pump 21.

First Embodiment

A first embodiment of the method for forming a GaN substrate of the present invention using the halide vapor phase epitaxy device will be explained.

Figure 3A:
FIGS. 3a–3f illustrate the process steps of a method of the present invention.
Figure 3B:
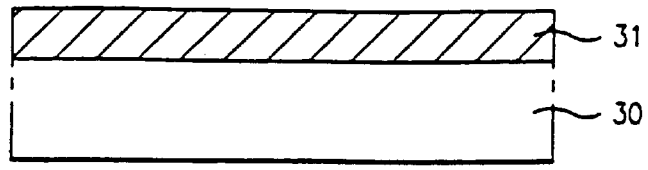
Figure 3C:
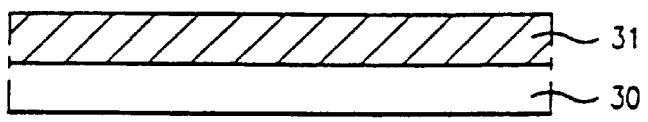
Figure 3D:
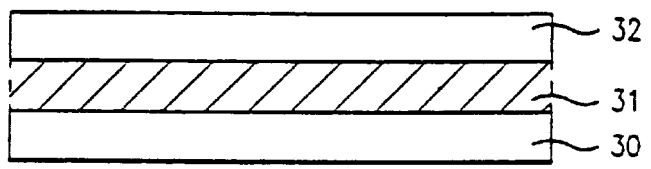
Figure 3E:
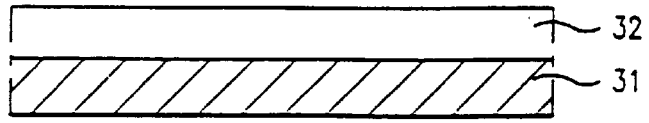
Figure 3F:
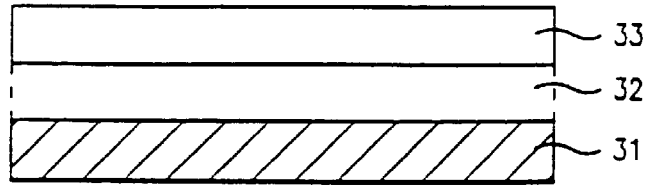

The process step starts with placing an oxide substrate 30 of 300–350 μm thickness[of, for example, spinnel ($MgAl_2O_4$)](See FIG. 3a) in the suscepter 16 in the quartz reacting tube 14 and placing Ga on the quartz boat 15, controlling the electric furnace 13" to maintain the high temperature region of the reacting tube at 1130° C., and feeding $NH_3$ and HCl gases thereto for 3–20 minutes, to pre-treat a surface of the oxide substrate. If a duration of the surface treatment is prolonged more than the above duration, defects in the form of steps or helix are formed on the surface of the grown GaN, and if the duration of the surface treatment is less than the above duration, the pre-treatment will not be satisfactory. Then, GaN is grown on the oxide substrate at 1030° C. for about 2 hours to a thickness of 50–100 μm(see FIG. 3b). In this instance, if the GaN is grown to a thickness thicker than 100 μm, cracks will develop in the GaN. Next, the back of the oxide substrate 30 of 300–350 μm thick is polished with silicon carbide(SiC) or diamond sand paper to a thickness of 100–150 μm, cleaned, and subjected to rapid thermal annealing at 600–900° C. in an ammonia or $N_2$ ambient(see FIG. 3c). Then a GaN layer 32 is grown on the first layer of GaN for about 2 hours at 1030° C. to a thickness 100–200 μm(see FIG. 3d). Thereafter, the remaining oxide substrate is polished completely off with silicon carbide(SiC) or diamond sand paper, cleaned again, and subjected to rapid thermal annealing at 600–900° C. in an ammonia or $N_2$ ambient(see FIG. 3e). Then, GaN 33 is grown for the third time on the second layer of GaN for about 2 hours at 1030° C. to a thickness 100–200 μm(see FIG. 3f). A GaN substrate of 300–500 μm thickness grown thus is mirror polished by means of automatic polisher using diamond powder of a grain size below 3 μm and sapphire powder($Al_2O_3$) of a grain size below 0.05 μm in succession to produce a GaN substrate of 250–350 μm thickness with an area of approximately 1 $cm^2$.

As explained, the GaN substrate is polished at the last stage for satisfactory removal of a bottom portion of the GaN layer having defects caused, not only by cracks present at a bottom portion of the formed GaN substrate, i.e., a portion of the GaN layer grown on the oxide substrate near to the substrate occurred due to cracks formed at an interface between the oxide substrate and GaN layer in an early stage of the grain growth, but also by crystal coalescence that exhibits FWHM(full width at half maximum) of an X-ray diffraction peak greater caused by mosaic structured crystal grain growth containing grain boundaries which have grain orientations different from one another, i.e., grain growth of grain regions with boundaries different from one another from coalescence of grain islands of different grain orientations formed in the process of heterepitaxial grain growth in which three dimensional nuclei having grain orientations different from the surface orientation of the substrate are formed in an initial stage of the grain growth and the nuclei are grown to coalesce one to another repeatedly. With the homoepitaxy, a defectless GaN n-type semiconductor substrate of a concentration of about $1 \times 10^{18}$ cm$^{-3}$ can be obtained.

Second Embodiment

Since an n-type conductive substrate of a concentration of about $1 \times 10^{18}$ cm$^{-3}$ is obtainable in the first embodiment, a second embodiment is made to obtain an n-type GaN single crystal substrate having a desired concentration.

The second embodiment method starts with placing a silicon substrate or silicon powder in the reactor 14 in the HVPE device, and making a reaction at 800–900° C. using HCl gas or a mixture of HCl gas and nitrogen gas, to form a silicon impurity source. The mirror polished GaN substrate of 250–350 μm thickness finally obtained in the first embodiment is caused to make reaction with the silicon impurity source in the reactor 14 in the HVPE device, to obtain an n-type GaN substrate of a high quality of $10^{18}$–$10^{20}$ cm$^{-3}$.

Third Embodiment

The third embodiment is provided to obtain a high quality p-type or non-conductive GaN single crystal substrate. In the third embodiment, powder of Zn, Cd or Mg is placed in the reactor in the HVPE device and caused to make reaction with HCl gas or a mixture of HCl gas and nitrogen gas at 800–900° C., to form impurity source of Zn, Cd or Mg. The mirror polished GaN substrate of 250–350 μm thickness obtained in the first embodiment is caused to react with the impurity source of Zn, Cd or Mg in the reactor 14 in the HVPE device, to obtain the p-type or non-conductive GaN substrate of a desired concentration.

Fourth Embodiment

Although the first to third embodiments allow forming a GaN single crystal substrate having a satisfactory size and a low crystal defect concentration, they have a long process time and it is difficult to assure reproducibility because the processes of GaN film growth and oxide removal should repeated for 2–3 times. Accordingly, this embodiment provides a method for forming a single crystalline GaN substrate, using the HVPE device, which has a short process time and an excellent reproducibility, which will be explained with reference to FIGS. 4a–4e.

Figure 4A:
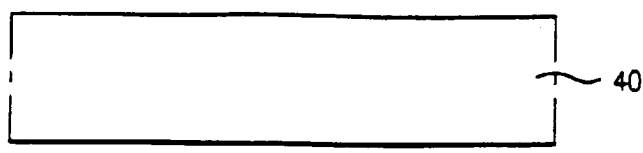
FIGS. 4a–4e illustrate respective sections in the process steps of a method of the present invention.
Figure 4B:
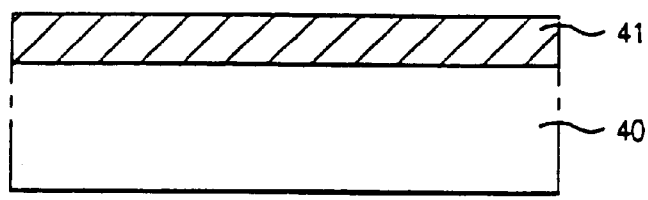
Figure 4C:
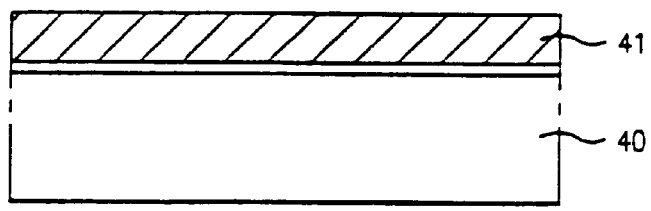

The fourth embodiment method starts with placing a rectangular(0001) sapphire substrate 40 in the susceptor 16 in the quartz reacting tube 14. In this instance, the sapphire substrate is placed over the susceptor 16 with a space of 350–500 μm to a top surface of the susceptor 16. Ga is accommodated on the quartz boat 15, and the electric furnace 13″ is controlled to have the high temperature region in the quartz reacting tube 14 at 1130° C., to pre-treat the surface of the oxide substrate 40 for about 3–20 minutes with HCl gas or ammonia gas. If the duration of the surface treatment is prolonged more than this specified time, defects in a form of steps or helix are formed on the surface of the grown GaN, and if the duration of the surface treatment is less than the above duration, the pre-treatment will not be satisfactory. Also, in this embodiment, an SiO$_2$ substrate may be used in place of the (0001) sapphire substrate 40. Then, as shown in FIG. 4b, GaN 41 is grown on the oxide substrate at 1,030° C. for about 60 minutes to a thickness of 40–80 μm. In this instance, the thickness of the GaN layer 41 growth should be adjusted according to the thickness of the sapphire substrate 40. This is because a process of optimization is required, since, as the thickness of the applied substrate is increased, a critical thickness at which cracks are developed is also increased. For example, when the sapphire substrate 40 is thick more than 350 μm at which the GaN layer 41 should also be grown thicker than about 80 μm, which is the critical thickness, the GaN layer 41 often develops cracks, causing difficulty in process control, because stress propagates toward the GaN with severe relaxation of the stress, not only in the sapphire substrate 40, but also in the GaN layer 41. Therefore, it is preferably to have the thickness of the sapphire substrate 40 to be around 150–200 μm, and the thickness of the GaN layer to be around 40–50 μm.

As is known well, GaN has an a-axis lattice constant of 3.189 Å and a thermal expansion coefficient of $5.59 \times 10^{-6}$ K$^{-1}$, and the(0001) sapphire substrate 40 has a a-axis lattice constant of 4.758 Å and a thermal expansion coefficient of $7.5 \times 10^{-6}$ K$^{-1}$. Therefore, when a lattice mismatch is viewed in the(0001)sapphire substrate 40 application, it is known that a compressive stress enforcing the GaN layer to match with the sapphire substrate 40 is generated in the GaN layer in which the grain growth has occurred and a tensile stress enforcing the sapphire substrate to match with a GaN lattice is generated in the sapphire substrate, that results in a stress relaxation, causing development of micro cracks toward the substrate in the vicinity of the interface. And, when the GaN is cooled down after the grain growth, the difference of thermal coefficients of the substrate and GaN causes thermal stress to extend the formed cracks, utilizing cooling for easy separation of the substrate and the GaN film. That is, the GaN film growth under the aforementioned conditions are cooled from the grain growth temperature of 1,030° C. down to 200° C. In this instance, the rate of the cooling should be controlled appropriately. Though in general an optimal cooling rate in an HVPE is 3° C./min, the cooling rate in the method of the present invention is preferably 10° C./min for causing separation of the sapphire substrate with ease. The sapphire substrate cracked into pieces is at a space over the susceptor. The cooling rate may be increased by increasing a flow rate of nitrogen gas. Thus, the sapphire substrate 41 is separated due to the relaxation effect of the thermal stress. Though there are cracks present in the vicinity of interface between the sapphire substrate 40 and the GaN layer 41, it can be noted that the cracks are reduced significantly as the thickness of the GaN layer 41 is increased. Rectangular, rather than disc type sapphire substrate is separated with ease by cracking.

Figure 4D:
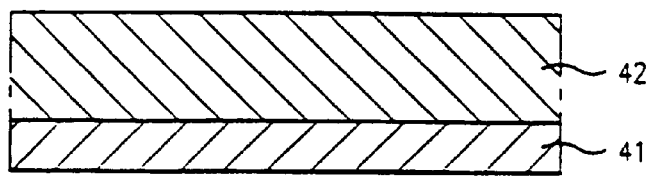
Figure 4E:

After the separation of the first GaN layer 41 from the sapphire substrate 40, the first GaN layer 41 is used in growth of a second GaN layer 42 as shown in FIG. 4d. In this instance, the flow rate of the nitrogen carrier gas was made to be at 2 l/min while elevating the substrate temperature from 200° C. to 1,030° C. Thus, the growth rate was increased to 100–200 μm/hr to grow the second GaN layer 42 for about 3–5 hours. In the later half of the growth, it is preferable to drop the growth rate to about 20 μm/hr for 1–2 hours to form a smooth surface. The thickness of the grown bulk form of GaN layer is about 300–600 μm. Thereafter, power and HCl gas supply to the electric furnace is stopped, the cooling rate is kept at 3° C./min, and NH$_3$ supply is maintained until the temperature is dropped down to 500° C. This second GaN layer 42 has significantly less crystal defect concentration because the heteroepitaxy caused by the conventional sapphire substrate application can be avoided with subsequent avoidance of the stress as the first GaN layer 41 having the sapphire substrate 40 removed completely therefrom can be utilized as a substrate. Because there are often cases when the sapphire substrate 40 is not completely separated from the GaN layer 41 due to lateral growth at a rim, about 2 mm width thereof, of the grown bulk form of GaN substrate, a cutting step to cut the rim portion is required. This cut of the substrate rim at 2 mm inside of the circumference results in a substrate with an area of 1 cm$^2$. Since there are micro cracks developed in the early formation process present at the back face of the GaN which was in contact with the sapphire substrate 40, the first GaN layer 41 is polished away completely to remove the portions with the micro cracks, after which a GaN semiconductor only of the second GaN layer 42 is mirror polished at its front and back faces. The front face thereof is mirror polished to improve a smoothness of the surface. The mirrorlike polishing is done using diamond powder of a grain size below 3 μm in an automatic polisher.

Figure 5A:
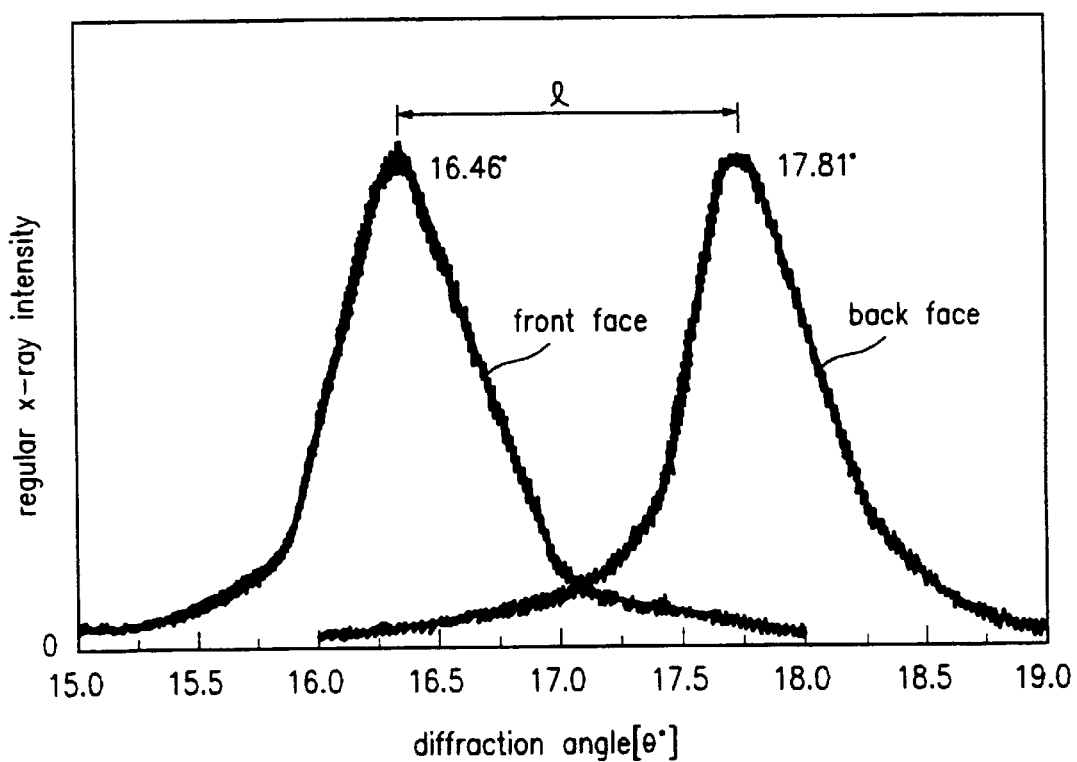
FIGS. 5a and 5b illustrate a graph showing diffraction angle vs. X-ray intensity at front and back faces of a GaN single crystal substrate formed in accordance with the present invention; and, FIG. 6 illustrates a section showing a blue laser diode in accordance with the present invention, schematically; and, FIG. 7 illustrates a section showing a GaN light emitting diode in accordance with the present invention, schematically.
Figure 5B:
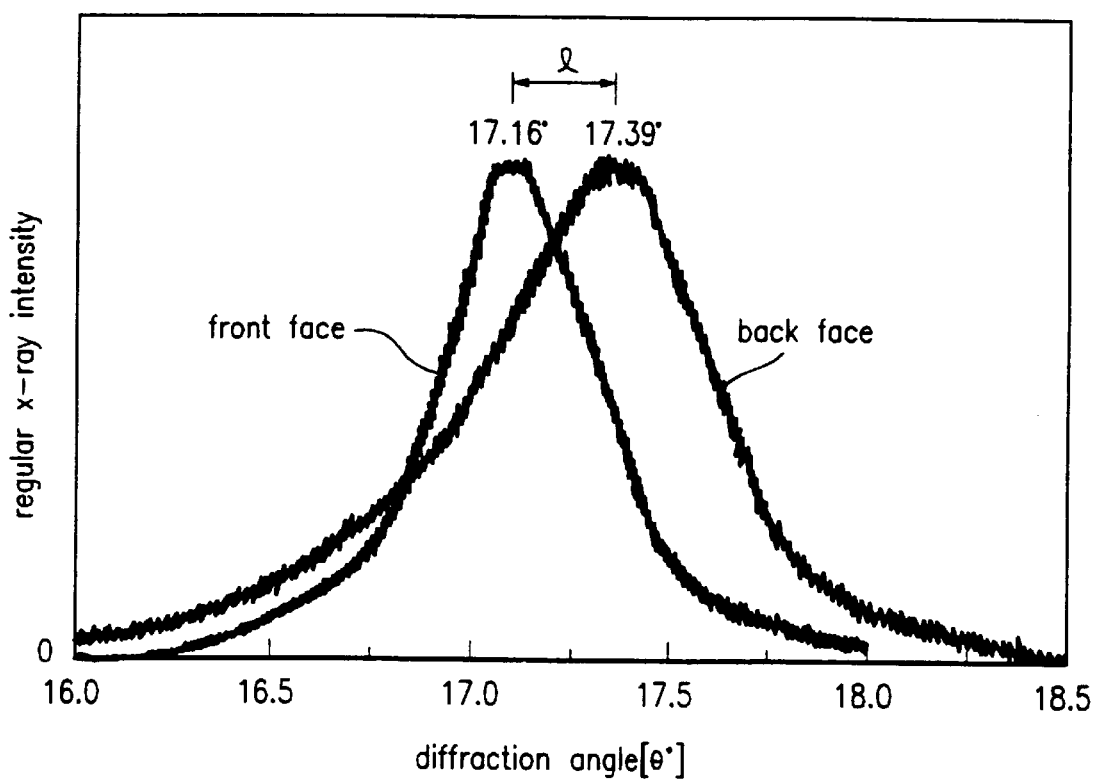

DXRD(double crystal X-ray diffraction) of the GaN substrate formed thus was conducted for its front and back surfaces to examine its characteristics. FIG. 5a illustrates the case of GaN grown in the conventional method, and FIG. 5b illustrates the case of bulk GaN grown in the method of the present invention. In the case of conventional method(FIG. 5a), there is a great difference l of 1.35° in positions of(0002) peak diffraction angles of front and back faces. In comparison to a diffraction angle of 17.3° in the case of no stress, it is known that there is high tensile stress exerted on the front face which shows decrease of the diffraction angle, and there is an increase of the diffraction angle in the back face due to compressive stress. In this instance, an FWHM (full width at half maximum) of X-ray was in general about 0.55°.

In the meantime, it was measured that in the case of GaN substrate(FIG. 5b) grown according to the method of the present invention also has tensile stress exerted on the front face thereof and compressive stress exerted on the back face thereof like the case of FIG. 5a. However, the positional difference l of the diffraction angles, being 0.23°, is significantly smaller compared to the 1.35° in the case of FIG. 5a, and the FWHM, being about 0.33°, shows that the grain formability is improved greatly.

Fifth Embodiment

Although the fourth embodiment method allows obtaining a GaN semiconductor substrate of a required size with an n-type conductivity and a carrier concentration of 0.5–2× 10$^{18}$ cm$^{-3}$, it is very difficult to obtain a desired carrier concentration. Therefore, the fifth embodiment method provided for obtaining a high quality n-type GaN substrate using silicon impurity in the second GaN growth process. That is, in the second GaN growth process, silicon or silicon powder is placed in the reactor 14 in the aforementioned HVPE device and reacts with a mixture of HCl gas and nitrogen gas at 800–900° C. Other process steps of the fifth embodiment method are identical to the first embodiment method, of which explanations are omitted. The impurity concentration may be controlled to be within a range of 10$^{18}$–10$^{20}$ cm$^{-3}$.

Sixth Embodiment

The sixth embodiment method is provided for forming a high quality p-type of non-conductive substrate. This sixth embodiment method is identical to the fifth embodiment method except the use of p-type source, such as Zn, Cd, or Mg placed in the reactor 14 in the aforementioned HVPE device, of which explanations will be omitted. However, a heat treatment process is added to the sixth embodiment method as a following process. This process is conducted at a process temperature of 650–800° C. in a nitrogen or argon ambient for a heat treatment duration of 10–20 minutes. This is because in general a p-type impurity has a high specific resistance. In order to convert a p-type semiconductor of a high specific resistance into a p-type semiconductor of a low specific resistance, coupling with hydrogen should be released. To do this, the heat treatment at 650–800° C. in an nitrogen or argon ambient is required. In order to suppress the decomposition of the nitrogen from the GaN layer at the elevated temperature, the heat treatment is preferably conducted in the nitrogen ambient. The formed p-type substrate has an impurity concentration of about 10$^{17}$–10$^{18}$ cm$^{-3}$.

As has been explained, the method for forming a GaN semiconductor single crystal substrate in accordance with the first to sixth embodiments of the present invention allows formation of a defectless single crystal bulk GaN semiconductor substrate of a size greater than 1 cm$^2$ at a temperature and a pressure lower than the conventional method, and has a simple and short time period of fabrication process and allows obtaining a high quality GaN single crystal substrate having a good reproducibility and fewer crystal defects allowing fabrication of an optical device that has a long life time and reliability.

Seventh Embodiment

In this seventh embodiment, a blue laser diode fabricated with the GaN substrate formed in any of the aforementioned embodiments is provided.

Figure 6:
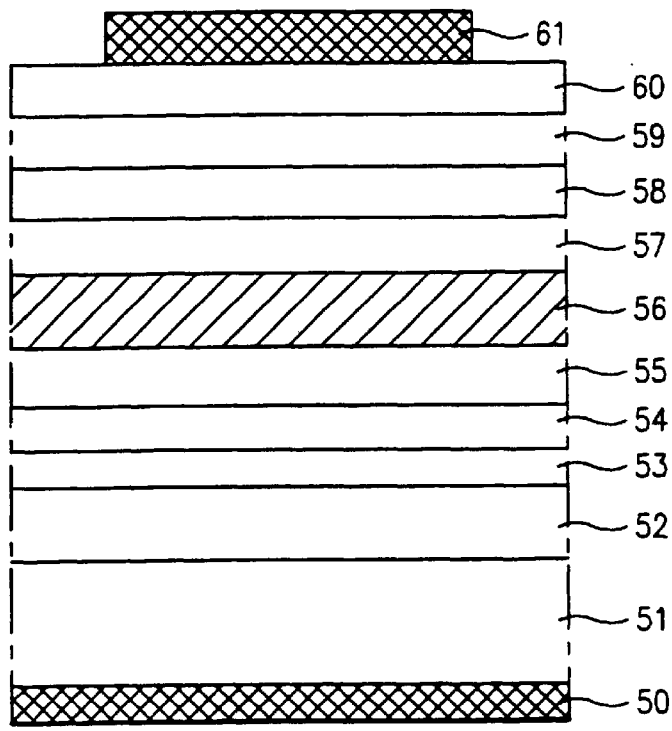

Referring to FIG. 6, the blue laser diode is provided with an n$^+$-GaN substrate 50 of 300–350 μm thickness obtained by homoepitaxial formation of a GaN substrate using the halide vapor phase epitaxy and silicon doping thereto, an n-type GaN layer 51 formed on the GaN substrate 50, of approx. 3 μm thickness doped with silicon, an In$_{0.05}$Ga$_{0.95}$N layer 52 formed on the n-type GaN layer 51 as a buffer layer of 1000 Å thickness doped with silicon, an n-type Al$_{0.05}$Ga$_{0.95}$N layer 53 formed on the n-type In$_{0.05}$Ga$_{0.95}$N layer 52 as a n-type clad layer of 4000 Å thickness doped with silicon, an n-type GaN layer 54 formed on the n-type Al$_{0.05}$Ga$_{0.95}$N layer 53 as an optical guide layer of 70 Å thickness doped with silicon, a multilayered quantum well layer 55 acting as an active layer of a stack of In$_{0.05}$Ga$_{0.95}$N layers each of a 50 Å thickness which is a barrier layer and In$_{0.2}$Ga$_{0.8}$N layers each of a 30 Å thickness which is a well layer, a p-type Al$_{0.2}$Ga$_{0.8}$N layer 56 formed on the multilayered quantum well layer 55 of 200 Å thickness doped with magnesium, a p-type GaN layer 57 formed on p-type Al$_{0.2}$Ga$_{0.8}$N layer 56 of 70 Å thickness doped with magnesium, a p-type Al$_{0.05}$Ga$_{0.95}$N layer 58 which is a p-clad layer formed on the p-type GaN layer 57 of 400 Å thickness doped with magnesium, a p-type GaN layer 59 which is an optical guide layer formed on the p-type Al$_{0.05}$Ga$_{0.95}$N layer 58 of 4000 Å thickness doped with magnesium, and an n-type electrode 60 and a p-type electrode 61 formed under the n$^+$-type GaN substrate 50 and on the p-type GaN layer 59 which is an optical guide layer, respectively. All of the n-type GaN layer 51 and the p-type GaN layer 59 over the n$^+$-type GaN substrate 50 are formed by identical metal organic chemical vapor deposition. The stack in the multilayered quantum well layer 55 acting as an active layer is formed with 3 to 5 alternating layers of an $In_{0.05}Ga_{0.95}N$ layer of a 50 Å thickness which is a barrier layer and an $In_{0.2}Ga_{0.8}N$ layer of a 30 Å thickness which is a well layer.

Because the formation of the $n^+$ GaN layer 51 on the $n^+$ GaN substrate 50 in this embodiment allows a high quality epitaxial growth significantly better than the heteroepitaxial growth of the conventional one formed over the sapphire substrate with a buffer layer inbetween, the aforementioned blue laser diode of this embodiment can solve the fundamental problem caused by the lattice mismatch and the thermal expansion coefficient difference.

Eighth Embodiment

The steps of a method for fabricating the aforementioned blue laser diode will be explained with reference to FIG. 6.

First, an $n^+$ GaN substrate 50 of 300–350 $\mu$m thickness obtained by homoepitaxial formation of a GaN substrate using the halide vapor phase epitaxy and silicon doping thereto, is provided. An n-type GaN layer 51 doped with silicon is formed on the GaN substrate 50 to a thickness of approx. 3 $\mu$m at 1010° C. by metal organic chemical vapor deposition. In this instance, $SiH_4$ or $Si_2H_6$ is used as a silicon source. Then, an n-type $In_{0.05}Ga_{0.95}N$ layer 52 doped with silicon is grown on the n-type GaN layer 51 as a buffer layer to an 1000 Å thickness at 800° C. by a process identical to the previous step. Next, an n-type $Al_{0.05}Ga_{0.95}N$ layer 53 doped with silicon is grown on the n-type $In_{0.05}Ga_{0.95}N$ layer 52 as an n-type clad layer to a 4000 Å thickness at 1010° C. by a process identical to the previous step. After forming an n-GaN layer 54 doped with silicon on the n-type $Al_{0.05}Ga_{0.95}N$ layer 53 to a 70 Å thickness at 1010° C. by a process identical to the previous step for forming an optical guide layer, a multilayered quantum well layer 55 of InGaN group acting as an active layer is formed by growing both $In_{0.05}Ga_{0.95}N$ layers which is a barrier layer to a 50 Å thickness at 780° C. and $In_{0.2}Ga_{0.8}N$ layers which is a well layer to a 30 Å thickness at 780° C. alternatively for 3–5 times. Then, by using metal organic chemical vapor deposition, a p-type $Al_{0.2}Ga_{0.8}N$ layer 56 and a p-type GaN layer 57, both doped with magnesium, are grown on the multilayered quantum well layer 55 to 200 Å and 70 Å thicknesses at 1010° C. in succession, respectively. A p-type $Al_{0.05}Ga_{0.95}N$ layer 58 and a p-type GaN layer 59, both doped with magnesium, are grown in succession to 4000 Å thickness at 1010° C. respectively, by a process identical to the previous step for forming a clad layer and an optical guide layer. In this instance, the p-type GaN layer 59 is grown to have an impurity concentration over $3 \times 10^{18}$ $cm^{-3}$ for forming a better p-type ohmic electrode in the next step. After lapping the substrate 50 to a thickness of approx. 100 $\mu$m, Ti/Al/Ni/Au layers 60, which forms an n-type ohmic contact electrode are deposited on the substrate 50 by an electron beam at 700° C. heat treatment temperature for 30 second to thicknesses of 100–300 Å/200 Å/500 Å/1000 Å respectively, and Cr/Ni/Au layers 61, which forms a p-type ohmic contact electrode, are deposited on the p-type GaN layer 59 by an electron beam at 500° C. heat treatment temperature for 30 seconds to thicknesses of 300 Å/500 Å/2000 Å respectively. After forming the n and p electrodes, the resultant is cleaved along "a" face(1120) of orientation to produce a chip.

In the aforementioned process, the silicon doped n-type $In_{0.05}Ga_{0.95}N$ layer 52 is formed for preventing occurrence of cracks in the n-type clad layer of the n-type $Al_{0.05}Ga_{0.95}N$ layer 53, both the n-type $Al_{0.05}Ga_{0.95}N$ layer 53 and the p-type $Al_{0.05}Ga_{0.95}N$ layer 58 are formed for constraining lights from the active layer of the quantum well layer 55, both the n-type GaN layer 54 and the p-type GaN layer 59 are formed for guiding lights, and the p-type $Al_{0.05}Ga_{0.95}N$ layer 56 is formed for enhancing a constraining effect against electrons injected into the InGaN quantum well layer 55 as well as protecting an interface of the InGaN quantum well layer 55.

By using the $n^+$-type GaN substrate formed by the halide vapor phase epitaxy instead of the conventional saphire or spinnel substrate, this embodiment excludes the crystal defects coming from the lattice mismatch and the thermal expansion coefficient difference and grows a thin film of high quality GaN group chemical semiconductor having a laser diode structure on the $n^+$-type GaN substrate by metal organic chemical vapor deposition.

Ninth Embodiment

Figure 7:
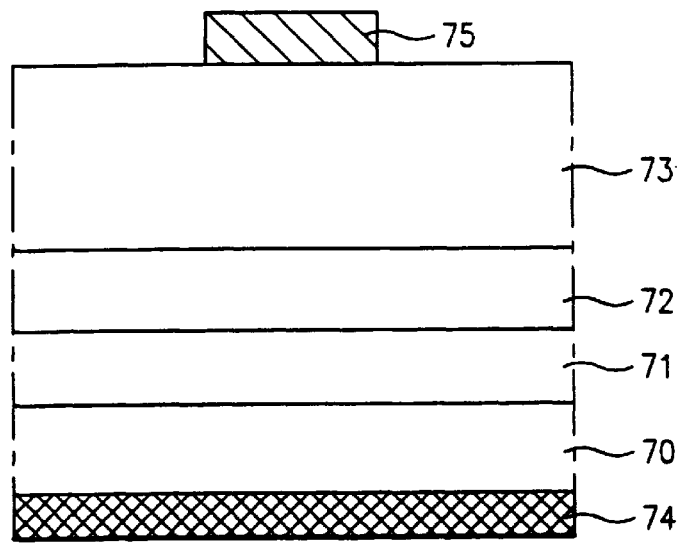

In the ninth embodiment, a GaN light emitting diode is fabricated using the aforementioned $n^+$-type GaN substrate. FIG. 7 illustrates a section of the GaN light emitting diode fabricated in accordance with the ninth embodiment of the present invention, schematically. The ninth embodiment GaN light emitting diode is provided with an $n^+$-type GaN substrate 70 of $5–10 \times 10^{18}$ $cm^{-3}$ impurity concentration obtained by homoepaxial growth by the halide vapor phase epitaxy and silicon doping, an n-type clad layer 71 of a silicon doped $Ga_xAl_{1-x}N$ ($0<x\leq1$) layer grown to a 3–5 $\mu$m thickness on the $n^+$-type GaN substrate 70, an active layer 72 of $In_xGa_{1-x}N$ layer ($0<x\leq1$) grown to a 300–500 Å thickness on the n-type clad layer 70, a p-type clad layer 73 of a magnesium doped $Ga_xAl_{1-x}N$ ($0<x\leq1$) layer grown to a 5000 Å thickness on the active layer 72, and an n-type electrode 74 and a p-type electrode 75 deposited on a back face of the substrate 70 and on a front face of the p-type clad layer 73, respectively. The x in the active layer is x=0.01–0.03 in the case of ultra-violet ray emitting diode, is x=0.22–0.25 in the case of blue light emitting diode, and is x=0.43–0.5 in the case of pure green light emitting diode. Also, the active layer 72 of $In_xGa_{1-x}N$ of a quantum well layer can be enhanced of its light emitting efficiency if a well layer of $In_{0.43-0.5}Al_{0.57-0.5}N$(or $In_{0.22-0.25}Al_{0.78-0.75}N$) and an overlying barrier layer of $In_{0.05}Ga_{0.95}N$ are formed alternatively for 3 to 5 times.

Tenth Embodiment

In this tenth embodiment, a method for fabricating the GaN LED of the ninth embodiment is embodied.

First, referring to FIG. 7, a silicon doped GaN substrate 70 is provided, which is formed by homoeptaxial growth by the halide vapor phase epitaxy to a 300–350 $\mu$m thickness and silicon doping to an impurity concentration of $5–10 \times 10^{18}$ $cm^{-3}$. In this instance, $SiH_4$ or $SiH_6$ is applied as a silicon source. Then, an n-type clad layer 71 of a silicon doped $Ga_xAl_{1-x}N$ ($0<x\leq1$) layer is grown to a 3–5 $\mu$m thickness in an $NH_3$ ambient at 950–1050° C. by metal organic chemical vapor deposition(MOCVD). An active layer 72 of $In_xGa_{1-x}N(0<x\leq1$) layer is grown on the n-type clad layer 71 to a 300–500 Å thickness at 720° C.–850° C. The x in the $In_xGa_{1-x}N$ is adjusted depending on a wavelength of the LED, for example, the x in the active layer is x=0.01–0.03 in the case of ultra-violet light emitting diode, is x=0.22–0.25 in the case of blue light emitting diode, and is x=0.43–0.5 in the case of pure green light emitting diode. And, the active layer 72 of $In_xGa_{1-x}N$ of a quantum well layer can be enhanced of its light emitting efficiency if a well layer of $In_{0.43-0.5}Al_{0.57-0.5}N$(or $In_{0.22-0.25}Al_{0.78-0.75}N$) and an overlying barrier layer of $In0.05Ga_{0.95}N$ are formed alternatively for several times. After formation of the active layer 72, a magnesium doped p-type clad layer 73 is formed to a 5000 Å thickness at an elevated temperature of 1000–1050° C. Then, after subjecting a back face of the n+-type GaN substrate 70 to lapping with boron carbide or diamond powder to a 100–150 μm thickness, polishing with Al₂O₃ powder, and washing n-type Ti/Al/Ni/Au is deposited thereon by a generally used method and subjected to annealing for 30 seconds at 700° C., to form an n-type ohmic contact electrode 74 thereon, and p-type Cr/Ni/Au is deposited on the p-type clad layer and subjected to annealing for 30 seconds at 500° C., to form a p-type ohmic contact electrode 75 thereon.

According to the ninth embodiment GaN LED and the method for fabricating the same, because an n+ GaN substrate homoeptaxially grown by the halide vapor phase epitaxy is used, crystal defects can be reduced down to $10^5$ $cm^{-3}$, allowing growth of a high quality thin film, that allows a high luminance, high throughput(high efficiency) LED available, because an n-type substrate can be formed on a back face of a substrate(conventionally, the n-type substrate is formed on the same face), an etching process step can be eliminated, which allows the fabrication process to be simple, because bonding of either one side of the p-type or n-type electrode is allowed, packaging is simple, and because of the simple cleaving process step, yield can be improved, and because the metal electrode deposited on the n-type electrode back face can also be used as a reflection mirror, the luminance efficiency can be improved.

As has been explained, the GaN bulk single crystal substrate and a GaN diode with the substrate of the present invention allows forming a GaN bulk single crystal substrate of a size greater than 1 cm² at a temperature and at a pressure lower than the conventional method, and in the case when a GaN bulk single crystal substrate is obtained by naturally separating a saphire substrate and a GaN layer by making a crack coming from the lattice mismatch and the thermal expansion coefficient difference between the saphire substrate and the GaN layer more severe using cooling down and fast speed homoepitaxial growth of a GaN layer on the separated GaN layer as a substrate, because not only the fabrication process is simple and the required fabrication time is short, but also the reproducibility is good and a high quality GaN single crystal substrate can be obtained, an optical device obtained using the GaN semiconductor bulk single crystal substrate and a GaN diode with the substrate of the present invention assures a long life time and a reliability.

And, when applied to blue/green laser diodes, a cavity can be formed easily by cleaving along a substrate crystal plane, because high quality n-type, p-type, or non-conductive substrate can be formed easily depending on selected injection of impurity, a variety of device structure can be realized by varying substrates, and because a metal electrode itself deposited on the back face of the n type electrode can be used as a reflection mirror, the luminance efficiency can be increased.

It will be apparent to those skilled in the art that various modifications and variations can be made in the method for forming a GaN semiconductor single crystal substrate and a GaN diode with the substrate of the present invention without departing from the spirit or scope of the invention. Thus, it is intended that the present invention cover the modifications and variations of this invention provided they come within the scope of the appended claims and their equivalents.

What is claimed is:

1. A method for forming a GaN single crystal substrate, the method comprising the steps of:

(1) providing and pre-treating an oxide substrate;

(2) growing a primary GaN layer on the pre-treated oxide substrate;

(3) polishing the oxide substrate having the primary GaN layer grown thereon to remove a portion of the oxide substrate;

(4) growing GaN again on the primary GaN layer after the step (3) to form a secondary GaN layer;

(5) polishing the oxide substrate again to remove a remained portion of the oxide substrate entirely;

(6) rowing a tertiary GaN layer on the primary and secondary GaN layers having the oxide substrate removed completely therefrom to form a bulk of a GaN semiconductor single crystal; and, (7) polishing the GaN semiconductor single crystal to form a mirror polished GaN substrate.

2. A method as claimed in claim 1, wherein the pre-treating step of the oxide substrate in step (1) includes the step of treating surfaces of the oxide substrate at 1130° C. in an ambient of HCl gas or ammonia gas for about 3–20 minutes each.

3. A method as claimed in claim 1, wherein the oxide substrate is a 300–350 μm thick sapphire or spinnel.

4. A method as claimed in claim 1, wherein in step (3), the polishing of the oxide substrate is conducted using silicon carbide or diamond sand paper to leave a thickness of 100–200 μm.

5. A method as claimed in claim 1, wherein each of the secondary and tertiary GaN layers has a thickness of 100–200 μm, the bulk of the GaN semiconductor single crystal has a thickness of 300–500 μm, and the mirror polished GaN substrate has a thickness of 250–350 μm.

6. A method as claimed in claim 1, further comprising the steps of:

cleaning the oxide substrate after removing the portion of the oxide substrate in the step (3); and, subjecting to rapid thermal annealing at 600–900° C. in an ammonia or nitrogen ambient.

7. A method as claimed in claim 1, further comprising the steps of:

placing high purity silicon powder in a reactor in a halide vapor phase epitaxy device after step (7) and reacting with HCl gas or a mixture of HCl gas and nitrogen gas at 800–900° C., to form a silicon impurity source; and, reacting the silicon impurity source with the mirror polished GaN semiconductor single crystal substrate obtained in step (7), to form a high quality n-type GaN single crystal substrate.

8. A method as claimed in claim 1, further comprising the steps of:

placing powder of Mg, Zn or Cd in a reactor in a halide vapor phase epitaxy device after step (7) and reacting with HCl gas or a mixture of HCl gas and nitrogen gas at 800–900° C., to form an impurity source of Mg, Zn or Cd; and, reacting the impurity source of Mg, Zn or Cd with the GaN semiconductor single crystal substrate obtained in step (7), to form a p-type conductive or non-conductive GaN single crystal substrate.

9. A method for forming a GaN single crystal substrate using a halide vapor phase epitaxy device including a reactor for reacting gases to cause GaN growth, a gas supplying part for regulating flow rates of the gases, and a gas diffuser for supplying the gases processed in the reactor, the method comprising the steps of:

(1) providing an oxide substrate and pre-treating the oxide substrate in the reactor;

(2) growing GaN on the pre-treated oxide substrate, to form a primary GaN layer;

(3) cooling down the oxide substrate and the primary GaN layer, to separate the primary GaN layer from the oxide substrate;

(4) growing GaN in a high growth rate with the separated GaN layer used as a substrate to form a secondary GaN layer, and forming a GaN bulk single crystal of a predetermined thickness from the secondary GaN layer; and, (5) polishing the GaN bulk single crystal to from a mirror polished GaN single crystal substrate.

10. A method as claimed in claim 9, wherein the oxide substrate is formed with (0001) sapphire, and the step of pre-treating the oxide substrate in step (1) includes the steps of placing gallium in a quartz boat in the reactor and pre-treating the oxide substrate at 1,130° C. for about 3–20 minutes in HCl and ammonia gases.

11. A method as claimed in claim 9, wherein the oxide substrate is formed of $SiO_2$, and the step of pre-treating the oxide substrate in step (1) includes the steps of placing gallium in a quartz boat in the reactor and pre-treating the oxide substrate at 1,130° C. for about 3–20 minutes in HCl and ammonia gases.

12. A method as claimed in claim 9, wherein the primary GaN layer is grown in the reactor at 1,030° C. for about 60 minutes to a thickness of 40–80 $\mu$m.

13. A method as claimed in claim 9, wherein step (3) includes the step of cooling the primary GaN layer from 1,030° C. down to 200° C. at a nitrogen flow rate of 4 l/min and a cooling rate of 10° C./min.

14. A method as claimed in claim 9, wherein step (4) of growing GaN includes the steps of growing at 1,030° C. for about 3–5 hours at a growth rate of 100 $\mu$m/hr and growing for about 1–2 hours at a growth rate of 20 $\mu$m/hr.

15. A method as claimed in claim 9, further comprising the step of cutting a rim portion of the bulk of the GaN single crystal between steps (4) and (5).

16. A method as claimed in claim 9, wherein step (5) of polishing the GaN bulk single crystal includes the steps of:

polishing the GaN single crystal until the primary GaN layer, which is a portion of the GaN single crystal, is completely removed; and polishing the front and the back faces of the remaining GaN layer into mirror surfaces.

17. A method as claimed in claim 9, wherein step (4) includes the steps of:

placing silicon or silicon powder in the reactor;

causing the silicon or silicon powder to react with a mixture of HCl gas and nitrogen gas at 800–900° C. in order to grow an n-type GaN layer having an impurity concentration of $10^{18}$–$10^{20}$ cm$^{-3}$.

18. A method as claimed in claim 9, wherein step (4) includes the steps of:

placing a p-type source in the reactor, the p-type source being Zn, Cd or Mg;

causing the p-type source to react with a mixture of HCl gas and nitrogen gas at 800–900° C. in order to grow a p-type or a non-conductive GaN layer.

19. A method as claimed in claim 9, further comprising the step of heat treating the p-type or a non-conductive GaN layer at 650–800° C. for 10–20 minutes after step (4).

20. A method for fabricating a blue laser diode, comprising the steps of:

providing an n$^+$-type GaN substrate homoeptaxially grown by halide vapor phase epitaxy;

successive growth of an n-type GaN layer, an n-type $In_xGa_{1-x}N$ layer($0 \leqq x \leqq 1$), an n-type $Al_xGa_{1-x}N$ layer and an n-type GaN layer, all of which are silicon doped, on the n$^+$-type GaN substrate;

growing a plurality times of alternating well layers of $In_{0.2}Ga_{0.8}N$ and barrier layers of $In_{0.05}Ga_{0.95}N$ on the n-type GaN layer, to form an active layer of multiple quantum well structure;

forming a p-type $Al_xGa_{1-x}N$ layer($0 \leqq x \leqq 1$), a p-type GaN layer, a p-type $Al_xGa_{1-x}N$ layer and a p-type GaN layer, all of which are magnesium doped, on the active layer, and forming an n-type ohmic contact electrode and a p-type ohmic contact electrode on an under side of the substrate and on the p-type GaN layer respectively.

21. A method as claimed in claim 20, wherein the plurality times of alternating growth is 3–5 times.

22. A blue laser diode, comprising:

an n-type GaN layer, an n-type $In_xGa_{1-x}N$ layer($0 \leqq x \leqq 1$), $Al_xGa_{1-x}N$ layer and an n-type GaN layer, all of which are silicon doped, on an n$^+$-type GaN substrate homoeptaxially grown by halide vapor phase epitaxy;

an active layer of a multiple quantum well form having a plurality of alternating layers of a well layer of $In_{0.2}Ga_{0.8}N$ and a barrier layer of $In0.05Ga_{0.95}N$ on the last n-type GaN layer;

a stack of a p-type $Al_xGa_{1-x}N$ layer, a p-type GaN layer, a p-type $Al_xGa_{1-x}N$ layer and a p-type GaN layer, all of which are magnesium doped, on the active layer in succession; and, an n-type ohmic contact electrode and a p-type ohmic contact electrode on an under side of the substrate and on the last p-type GaN layer, respectively.

23. A blue laser diode as claimed in claim 22, wherein the active layer of a multiple quantum well form includes 3 to 5 alternate layers of a well layer and a barrier layer.

24. A method for fabricating a GaN light emitting diode, comprising the steps of:

providing an n$^+$-type GaN substrate obtained by homoeptaxial growth with a halide vapor phase epitaxy and silicon doping;

forming an n-type $In_xAl_{1-x}N$ layer, an n-type $In_xGa_{1-x}N$ layer, an n-type $Ga_xAl_{1-x}N$ layer on the n$^+$-type GaN substrate in succession by metalorganic chemical vapor deposition, to form an n-type clad layer, an active layer and a p-type clad layer; and, forming an n-type ohmic contact electrode and a p-type ohmic contact electrode on an under side of the substrate and on the p-type clad layer, respectively.

25. A method as claimed in claim 24, wherein the x in the active layer $In_xGa_{1-x}N$ is 0.01–0.03.

26. A method as claimed in claim 24, wherein the x in the active layer $In_xGa_{1-x}N$ is 0.22–0.25.

27. A method as claimed in claim 24, wherein the x in the active layer $In_xGa_{1-x}N$ is 0.45–0.5.

28. A GaN light emitting diode, comprising:

an n$^+$-type GaN substrate obtained by homoeptaxial growth with a halide vapor phase epitaxy and silicon doping;

an n-type clad layer of a $Ga_xAl_{1-x}N$ layer($0 \leqq x \leqq 1$) grown on the n$^+$-type GaN substrate;

a p-type clad layer of an $In_xAl_{1-x}N$ layer($0 \leqq x \leqq 1$) grown on the n-type clad layer; and, an n-type ohmic contact electrode and a p-type ohmic contact electrode on an under side of the substrate and on the p-type clad layer, respectively.

29. A GaN light emitting diode as claimed in claim 28, wherein the x in the active layer $In_xGa_{1-x}N$ is 0.22–0.25.

30. A GaN light emitting diode as claimed in claim 28, wherein the quantum well structure further includes a barrier layer of $In_{0.05}Ga_{0.95}N$ on the $In_xGa_{1-x}N(0 \leqq x \leqq 1)$ layer.

* * * * *